(12) United States Patent
Chainer et al.

(10) Patent No.: US 10,548,228 B2
(45) Date of Patent: Jan. 28, 2020

(54) THERMAL INTERFACE ADHESION FOR TRANSFER MOLDED ELECTRONIC COMPONENTS

(71) Applicant: International Business Machines Corporation, Armonk, NY (US)

(72) Inventors: Timothy J. Chainer, Putnam Valley, NY (US); Michael A. Gaynes, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 920 days.

(21) Appl. No.: 15/060,137

(22) Filed: Mar. 3, 2016

(65) Prior Publication Data
US 2017/0257977 A1    Sep. 7, 2017

(51) Int. Cl.
*H05K 3/30* (2006.01)
*H05K 1/18* (2006.01)

(52) U.S. Cl.
CPC .............. *H05K 3/30* (2013.01); *H05K 1/185* (2013.01); *Y10T 29/4913* (2015.01)

(58) Field of Classification Search
CPC ........ H05K 3/30; H05K 3/284; H05K 1/0209; H05K 1/185; B29C 45/372; B29C 45/14655; Y10T 29/4913; Y10T 29/49124; Y10T 29/49117; Y10T 29/49002
USPC ................................ 29/832, 829, 825, 592.1
See application file for complete search history.

(56) References Cited

U.S. PATENT DOCUMENTS

| 2,313,985 | A  | 3/1943  | Bradshaw         |
| 5,041,902 | A  | 8/1991  | McShane          |
| 5,254,500 | A  | 10/1993 | AuYeung          |
| 5,608,267 | A  | 3/1997  | Mahulikar et al. |
| 6,036,023 | A  | 3/2000  | Pfhanl et al.    |
| 6,950,305 | B2 | 9/2005  | Miles et al.     |
| 7,226,804 | B2 | 6/2007  | Shin et al.      |

(Continued)

OTHER PUBLICATIONS

Shinko Electric Industries Co.,Ltd., P-VQFN (Plastic Very Thin Quad Flat Non-leaded). Downloaded from http://www.shinko.co.jp/english/product/leadframe/p-vqfn.html on Feb. 18, 2016. pp. 1-2.

(Continued)

*Primary Examiner* — Peter Dungba Vo
*Assistant Examiner* — Azm A Parvez
(74) *Attorney, Agent, or Firm* — Daniel P. Morris; Otterstedt, Wallace & Kammer, LLP (57) ABSTRACT

An electronic component to be encapsulated is introduced into a mold cavity. The mold cavity includes at least first and second halves, and at least one of the halves is formed with a negative of a thermal-interface-material engaging pattern thereon. An encapsulating material, which encapsulates the electronic component and engages the negative of the thermal-interface-material engaging pattern, is introduced into the mold cavity. The encapsulating material is allowed to solidify such that a thermal-interface-material engaging surface of the encapsulant solidifies with the thermal-interface-material engaging pattern thereon. During subsequent assembly, the thermal-interface-material engaging pattern engages thermal interface material to resist lateral motion of the thermal interface material.

1 Claim, 8 Drawing Sheets

(56) References Cited

U.S. PATENT DOCUMENTS

| | | | |
|---|---|---|---|
| 8,922,024 B2* | 12/2014 | Na | H01L 23/5226 |
| | | | 257/774 |
| 2001/0013649 A1 | 8/2001 | Wensel | |
| 2002/0076856 A1 | 6/2002 | Wensel | |
| 2002/0153637 A1 | 10/2002 | Chandra | |
| 2002/0158366 A1 | 10/2002 | Chandra | |
| 2002/0187584 A1 | 12/2002 | Bolken | |
| 2002/0190429 A1 | 12/2002 | Bolken | |
| 2003/0086994 A1 | 5/2003 | Johnson | |
| 2003/0137060 A1 | 7/2003 | Bolken | |
| 2003/0194459 A1 | 10/2003 | Tan | |
| 2004/0033644 A1 | 2/2004 | Wensel | |
| 2004/0169265 A1 | 9/2004 | Bolken | |
| 2006/0110850 A1 | 5/2006 | Bolken | |
| 2006/0286712 A1 | 12/2006 | Brunschwiler | |
| 2009/0080323 A1 | 3/2009 | Cavallini et al. | |
| 2010/0147497 A1 | 6/2010 | Furman et al. | |
| 2010/0196651 A1 | 8/2010 | Liao et al. | |
| 2012/0146247 A1* | 6/2012 | Pomerantz | G06K 19/07732 |
| | | | 257/787 |
| 2017/0053859 A1* | 2/2017 | Liang | H01L 23/49827 |

OTHER PUBLICATIONS

Case Study Examples. Downloaded from http://www.scudc.scu.edu/cmdoc/re_doc/05_case_study.frm6.html on Jan. 23, 2016. pp. 1-4, 1995 and 1997 Advanced CAE Technology, Inc.

Anon., Wikipedia, Quad Flat No-leads package. Downloaded from https://en.wikipedia.org/wiki/Quad_Flat_No-leads_package on Jan. 23, 2016. pp. 1-4.

Anon., Wikipedia, Transfer molding. Downloaded from https://en.wikipedia.org/wiki/Transfer_molding on Jan. 23, 2016. pp. 1-2.

* cited by examiner

THERMAL INTERFACE ADHESION FOR TRANSFER MOLDED ELECTRONIC COMPONENTS

STATEMENT OF GOVERNMENT RIGHTS

Not Applicable.

CROSS-REFERENCE TO RELATED APPLICATIONS

Not Applicable.

FIELD OF THE INVENTION

The present invention relates to the electrical, electronic, computer, and mechanical arts, and, more particularly, to electronic packaging technology, thermal control, and the like.

BACKGROUND OF THE INVENTION

Electronic components are typically encapsulated by transfer molding. For rapid and easy release from mold cavities, mold release agents are included in the formulation of transfer molding compounds. After the molding process, these release agents are present on the surface of the molded components. It is very challenging for thermal interface materials (TIMs) to adhere to the resulting very low surface energy surfaces (<35 ergs/cm$^2$). In the past, the surface of the component has been treated to provide higher energy surfaces for improved TIM adhesion. Such treatments include wiping the surface with isopropyl alcohol, abrading the surface and then wiping with isopropyl alcohol, or exposing the surface to a plasma cleaning process or ultraviolet (UV) light and/or ozone. These are non-routine processes that are typically performed at the card assembly factory and are significantly manual in nature.

Heat dissipation has become a major technical challenge for complex printed circuit board (PCB) assemblies. Rather than using individual heat sinks for every component, very large (in excess of four square feet or 0.37 square meters), common heat spreaders are being used over an array of components and component types. Due to the mismatch in coefficient of thermal expansion between the heat spreader, which is typically aluminum (coefficient of thermal expansion 23.6 ppm/C (parts per million per degree Celsius)) and PCB assembly (coefficient of thermal expansion ~17 ppm/C) and the large thermal mass of both the heat spreader and PCB assembly, significant relative movement occurs during temperature excursions resulting from powering the circuitry on and off. The TIM which physically bridges the gap between the heat spreader and PCB must accommodate this movement without breaking down. Because of the inherent low surface energy of transfer molded component surfaces, the TIM can slide along these surfaces when it is sheared or compressed by the relative movement, and over time, can move out of the gap. The result is increasing thermal resistance which leads to decreased reliability, and in a worst case scenario, fire. Because of the size of the PCB assemblies, batch processing in plasma or UV and/or ozone is very costly. Abrasion and isopropyl wipe techniques are undesirable as well because of the handling and debris generation.

SUMMARY OF THE INVENTION

Principles of the invention provide techniques for thermal interface adhesion for transfer molded electronic components. In one aspect, an exemplary method includes the step of introducing into a mold cavity an electronic component to be encapsulated. The mold cavity includes at least first and second halves, and at least one of the halves is formed with a negative of a thermal-interface-material engaging pattern thereon. Further steps include introducing into the mold cavity an encapsulating material which encapsulates the electronic component and engages the negative of the thermal-interface-material engaging pattern, and allowing the encapsulating material to solidify such that a thermal-interface-material engaging surface of the encapsulant solidifies with the thermal-interface-material engaging pattern thereon.

In another aspect, another exemplary method includes the step of providing an encapsulated electronic component mounted on a printed circuit board. The encapsulated electronic component has an outward-facing thermal-interface-material engaging pattern on an encapsulant thereof. A further step includes securing a heat sink to the encapsulated electronic component on the printed circuit board with a thermal interface material intermediate the heat sink and the thermal-interface-material engaging pattern of the encapsulant such that the thermal-interface-material engaging pattern engages the thermal interface material to resist lateral motion of the thermal interface material.

In still another aspect, an exemplary assembly includes a printed circuit board and an encapsulated electronic component mounted on the printed circuit board. The encapsulated electronic component in turn includes an encapsulant with an outward-facing thermal-interface-material engaging pattern thereon. Additional elements include a heat sink and a thermal interface material intermediate the heat sink and the thermal-interface-material engaging pattern of the encapsulant. The heat sink is assembled to the printed circuit board such that the thermal-interface-material engaging pattern engages the thermal interface material to resist lateral motion of the thermal interface material.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments reduce or eliminate undesirable displacement of thermal interface material without costly additional processing and/or handling steps and/or debris generation.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

As noted above, electronic components are typically encapsulated by transfer molding. For rapid and easy release from mold cavities, mold release agents are included in the formulation of transfer molding compounds. After the molding process, these release agents are present on the surface of the molded components. It is very challenging for thermal interface materials (TIMs) to adhere to the resulting very low surface energy surfaces. In the past, the surface of the component has been treated to provide higher energy surfaces for improved TIM adhesion. Such treatments include wiping the surface with isopropyl alcohol, abrading the surface and then wiping with isopropyl alcohol, or exposing the surface to a plasma cleaning process or ultraviolet (UV) light and/or ozone. These are non-routine processes that are typically performed at the card assembly factory and are significantly manual in nature.

Figure 1:
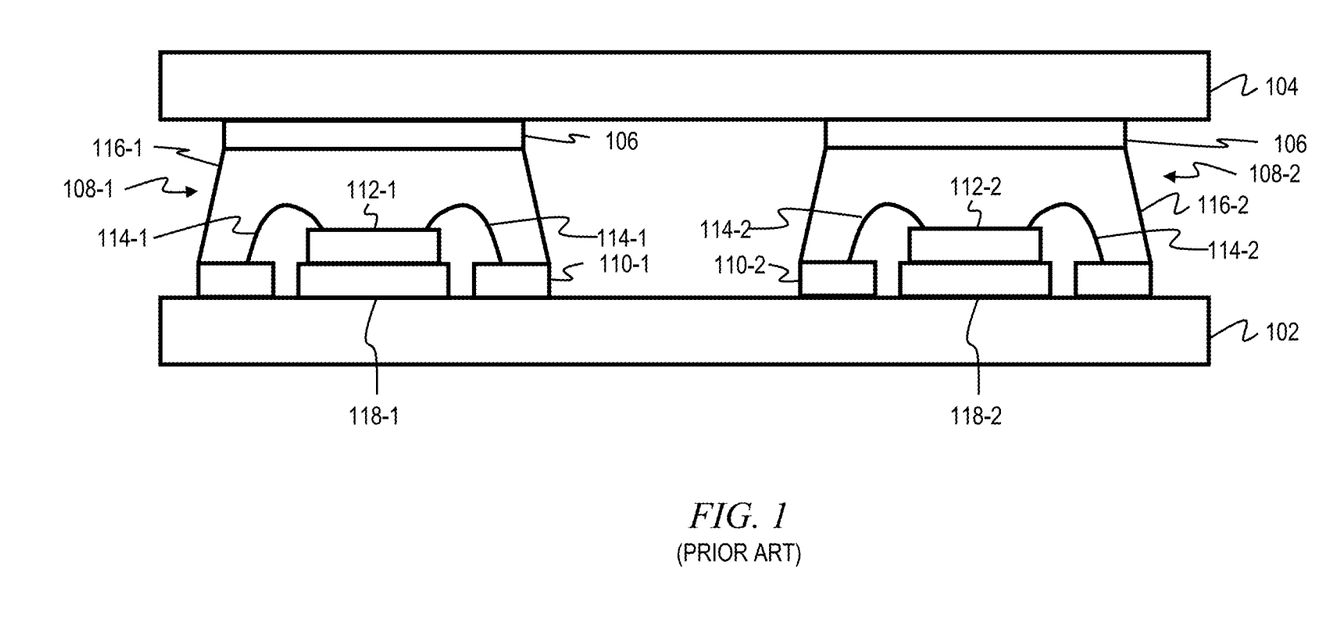
FIG. 1 shows a relationship between a PCB assembly with encapsulated electronic components, heat sink, and TIM, according to the prior art.

As also noted above, heat dissipation has become a major technical challenge for complex printed circuit board (PCB) assemblies. Rather than using individual heat sinks for every component, very large (in excess of four square feet or 0.37 square meters), common heat spreaders are being used over an array of components and component types. FIG. 1 shows a relationship between a PCB assembly with encapsulated electronic components, heat sink, and TIM, according to the prior art. Note the PCB 102, heat sink 104, thermal interface material 106, and encapsulated electronic components 108-1 and 108-2. Each component includes a lead frame 110-1, 110-2; a semiconductor die 112-1, 112-2; wires 114-1, 114-2; encapsulant material 116-1, 116-2; and optionally an exposed pad 118-1, 118-2.

Due to the mismatch in coefficient of thermal expansion between the heat spreader 104, which is typically aluminum (coefficient of thermal expansion 23.6 ppm/C (parts per million per degree Celsius)) and PCB assembly (coefficient of thermal expansion ~17 ppm/C for PCB 102) and the large thermal mass of both the heat spreader and PCB assembly, significant relative movement occurs during temperature excursions resulting from powering the circuitry on and off. The TIM 106 which physically bridges the gap between the heat spreader and PCB must accommodate this movement without breaking down. Because of the inherent low surface energy of transfer molded component surfaces (i.e. surface of encapsulant 116-1, 116-2), the TIM can slide along these surfaces when it is sheared or compressed by the relative movement, and over time, can move out of the gap. Shearing of course refers to lateral movement of heat sink 104 with respect to PCB 102 while compression refers to heat sink 104 moving towards PCB 102. The result is increasing thermal resistance which leads to decreased reliability, and in a worst case scenario, fire. Because of the size of the PCB assemblies, batch processing in plasma or UV and/or ozone is very costly. Abrasion and isopropyl wipe techniques are undesirable as well because of the handling and debris generation.

A thermal interface material 106 between a heat spreader 104 and electronic components (e.g. encapsulant 116-1, 116-2 thereof) undergoes mechanical deformation as a function of temperature cycles. This gap variation can result in the thermal interface material being "pumped" out of the gap, which in turn results in an increase in the thermal resistance between the component and heat spreader.

Figure 2:
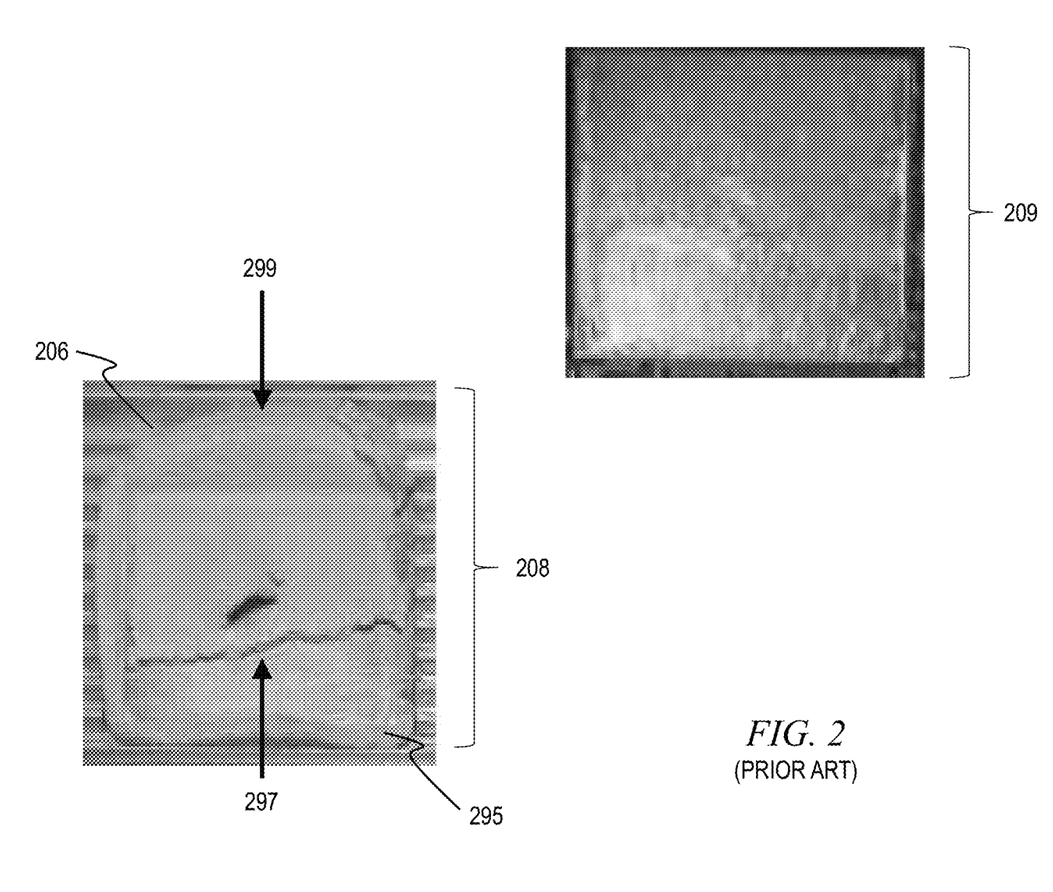
FIG. 2 shows photographs of undesirable TIM displacement, according to the prior art.
Figure 3:
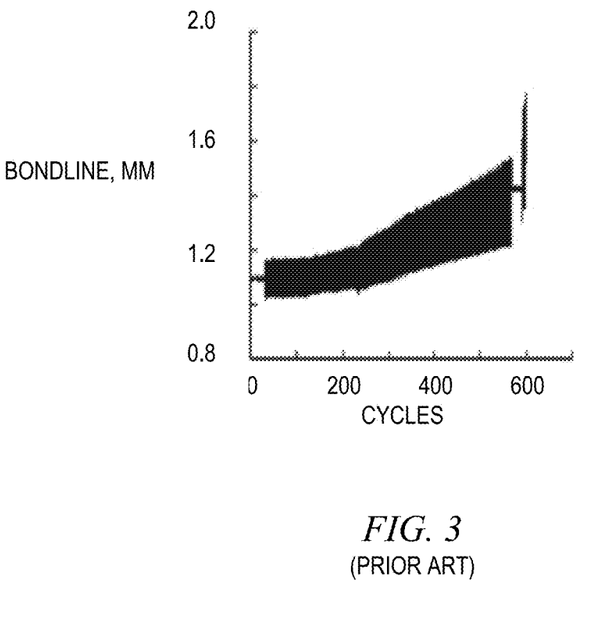
FIG. 3 shows variation in capacitive bondline with number of on-off cycles for the system of FIG. 2, according to the prior art.

FIG. 2 shows photographs of undesirable TIM displacement, according to the prior art, while FIG. 3 shows variation in capacitive bondline with number of on-off cycles for the system of FIG. 2, according to the prior art. In particular, as shown in FIG. 2, a thermal interface material 206 which was placed between a transfer molded component 209 and a heat spreader 208 showed movement after a few hundred thermal cycles. The results were observed by measuring the capacitive bondline, as in FIG. 3, and by physical observation. Arrow 297 shows one edge of the displaced TIM which has been displaced from the corresponding area 295 of the heat spreader 208, while arrow 299 shows how the TIM has been pushed or extruded beyond the initial area of the heat spreader that was mated to the transfer molded component.

FIG. 2 thus shows the TIM movement between a transfer molded component 209 and heat spreader 208. The transfer molded component 209 has a piece of copper tape on it so that capacitance measurement of the TIM in the gap could be carried out during thermal cycling. The aluminum heat spreader 208 had a surface roughness that was smoother than three microns and it can be seen that the TIM moved during thermal cycling as evidenced by both the changes in capacitive bond line in FIG. 3 as well as the photo of the TIM movement in FIG. 2.

It was found by experiment that the TIM movement can be significantly reduced by roughening the aluminum heat spreader to a roughness greater than three microns. To address the question about the impact of the copper tape on the surface of the transfer molded component, an experiment was conducted without the copper tape and with a smooth (less than three microns of roughness) aluminum heat spreader—the capacitive bond line could not be measured in this experiment because of no copper tape. However, after the cycling test, the heat spreader was separated from the PCB and it was observed that there was evidence of the TIM movement, just as when a smooth aluminum heat spreader was used and the copper tape was present on the surface of the transfer molded component. It can be concluded that as long as one surface is roughened more than three microns, the TIM movement during a thermal cycle can be significantly reduced. One or more embodiments address the transfer molder surface rather than the heat spreader surface.

Figure 4:
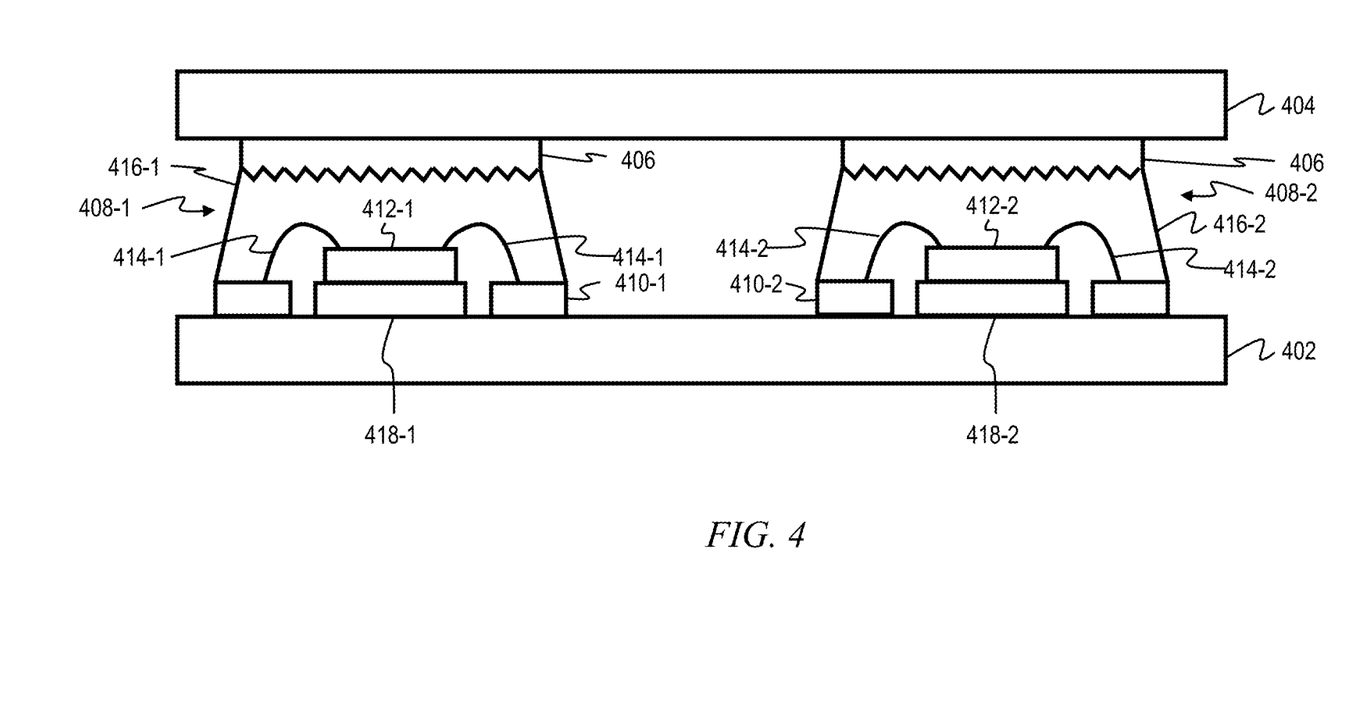
FIG. 4 shows a relationship between a PCB assembly with encapsulated electronic components, heat sink, and TIM, according to an embodiment of the invention.

FIG. 4 shows a relationship between a PCB assembly with encapsulated electronic components, heat sink, and TIM, according to an aspect of the invention, wherein elements corresponding to those in FIG. 1 have received the same reference character incremented by three hundred. Note the PCB 402, heat sink 404, thermal interface material 406, and encapsulated electronic components 408-1 and 408-2. Each component includes a lead frame 410-1, 410-2; a semiconductor die 412-1, 412-2; wires 414-1, 414-2; encapsulant material 416-1, 416-2; and optionally an exposed pad 418-1, 418-2.

Figure 5:
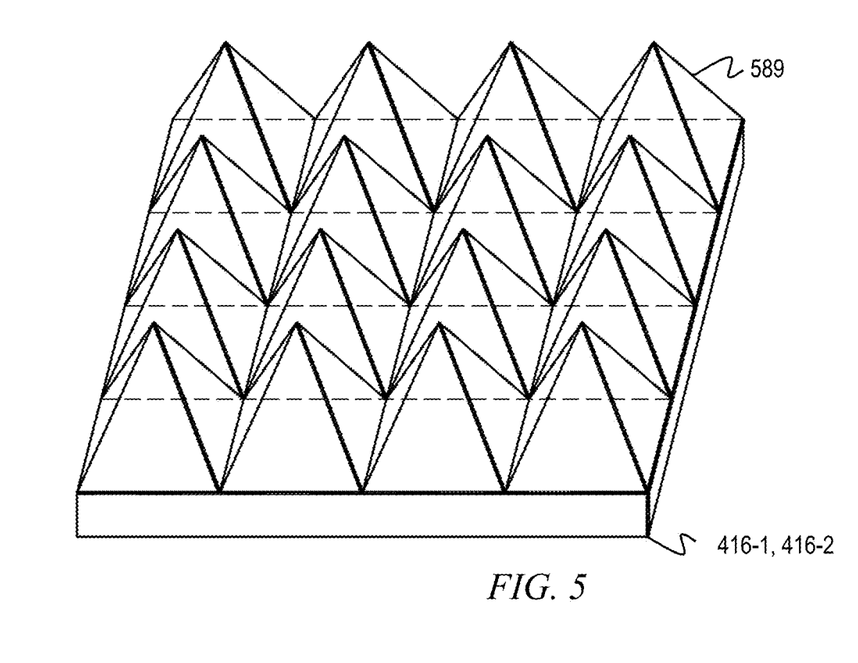
FIG. 5 shows details of a diamond pattern on encapsulation material of the assembly of FIG. 4, and also represents the negative of a portion of a mold, according to an embodiment of the invention.

One or more embodiments, such as the embodiment shown in FIG. 4, advantageously provide a low cost, manufacturable method of improving the adhesion of a thermal interface material between a transfer molded electronic component and a thermal heat spreader by modifying the component surface during the molding process. In particular, one or more embodiments pattern the mold (see discussion of FIG. 6 below) used in the creation of a transfer molded electronic packaged component to create a surface roughness or distinct features (e.g. a diamond pattern in top surface of encapsulant 416-1, 416-2 as seen in FIG. 5) which improve the adhesion characteristics of the thermal interface material 406 and heat spreader 404. The incorporation of the pattern into the mold provides a low cost method to create patterns which enhance the adhesion of the thermal interface material 406. Here, as seen in FIG. 5, a series of diamond-shaped "teeth" 589 are formed on the outward face of the encapsulant 416-1, 416-2 during the molding process, which teeth engage or "bite" into the TIM 406 to reduce or eliminate relative motion.

FIG. 5 also represents the negative of a portion of a mold, according to an embodiment of the invention, as per FIG. 6 discussed below.

Heat sink 404 can be liquid cooled, air cooled, or work via conduction, and can be made, for example, from aluminum, copper, or the like. PCB 402 can be made of known materials such as a glass fiber reinforced (fiberglass) epoxy resin substrate with a copper foil bonded on to one or both sides. These are non-limiting examples of materials.

One or more embodiments reduce or eliminate completely the need for additional processes at the PCB assembly operation, inasmuch as patterns (e.g., of teeth 589) on the surface of a component in turn provide a zero velocity boundary condition for a thermal interface material 406 on the electronic overmolded surface 416-1, 416-2.

Figure 6:
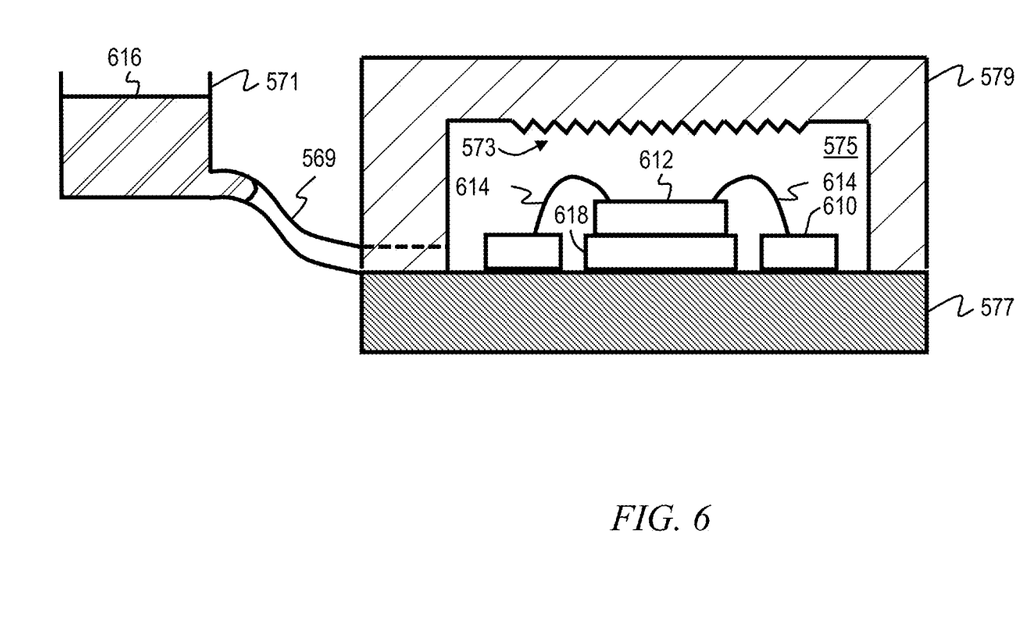
FIGS. 6 and 7 show a transfer molding process for producing the encapsulated electronic components of FIGS. 4 and 5, according to an embodiment of the invention.
Figure 7:
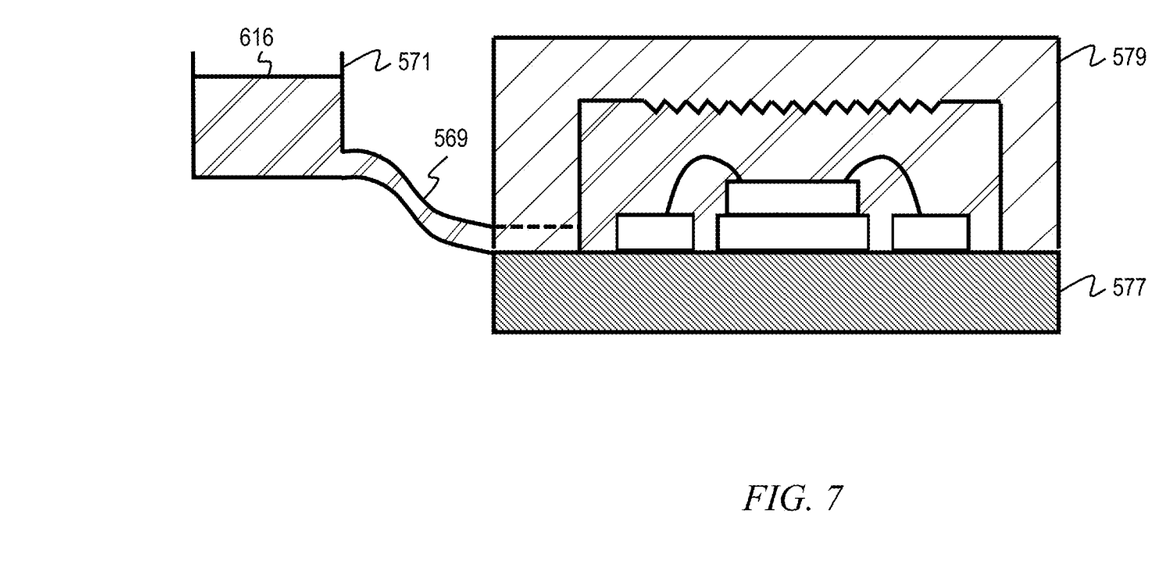

FIGS. 6 and 7 show a transfer molding process for producing the encapsulated electronic components of FIGS. 4 and 5, according to an embodiment of the invention. An upper mold portion 579 and lower mold portion 577 cooperatively define a cavity 575 which receives a component to be encapsulated. The component includes a lead frame 610; a semiconductor die 612; wires 614; and optionally an exposed pad 618. Encapsulant material 616 in a reservoir 571 is provided to cavity 575 through channel 569 and surrounds and encapsulates the component (FIG. 6 shows encapsulant 616 just starting down channel 569 while FIG. 7 shows encapsulant 616 filling the cavity 575 and surrounding the component to be encapsulated). Upper mold portion 579 is formed with a negative of the diamond pattern of FIG. 5 as seen at 573 and produces the positive pattern of FIG. 5 in the encapsulant 616 when same flows into the cavity 575.

Only a single mold cavity and channel 569 are shown for simplicity but multiple cavity molds can of course be employed for efficiency.

Thus, one or more embodiments provide a pattern on the roof of the mold cavity. In one or more embodiments, the pattern is imparted on the mold cavity surface and the transfer molding process does not need to be altered in any other way. Regarding encapsulants, typical transfer molding compounds include a phenolic novolac epoxy resin and a phenolic novolac hardener. A polyamine catalyst is used to speed up the cross-linking reaction. Silica filler is added, typically to 65 to 70% wt. The filler could be pretreated with either an epoxy or amino silane adhesion promoter or the adhesion promoter could be added directly to the formulation. The purpose of the adhesion promoter is to promote chemical bonding between the filler surface and the reacting epoxy resin. Additional additives in a typical transfer molding compound formulation include flame retardants, mold release agents to facilitate removal from the mold after transfer molding, carbon black as a pigment, and stress absorbing agents to manage thermal mechanical stresses in the transfer molded electronic module.

Transfer molding is commonly done at 175 C, under 170 MPa of pressure in 60 to 90 seconds—after being released from the mold cavity, parts are post cured at 175 C for between four and eight hours; these parameters are exemplary and non-limiting.

In one or more embodiments, the patterned surface finish includes finishes that have an average roughness (Ra) of 3.2 microns or more. The surface finish of the mold cavity could be imparted through bead blasting or machining, for example. In the case of bead blasting, either the entire mold cavity surface can be treated, or a frame at the perimeter could be treated, serving as a blockade to movement out of the gap between a component surface and heat spreader. In the case of machining, specific patterns can be defined with a channel depth, cross-section and pitch. The channel patterns created can be provided with an angled vertical wall, or draft angle of at least 1 degree, such as an inverted triangle or trapezoidal cross-section to allow easy release after the transfer molding process.

Figure 8:
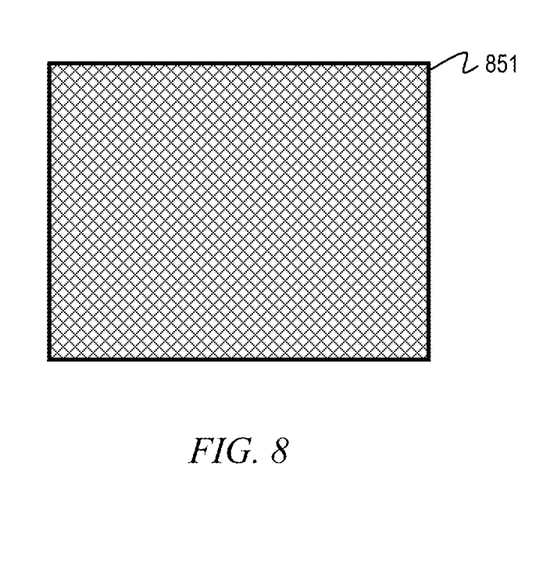
FIG. 8 shows an embodiment wherein an entire surface of encapsulation material is patterned, according to an embodiment of the invention.
Figure 9:
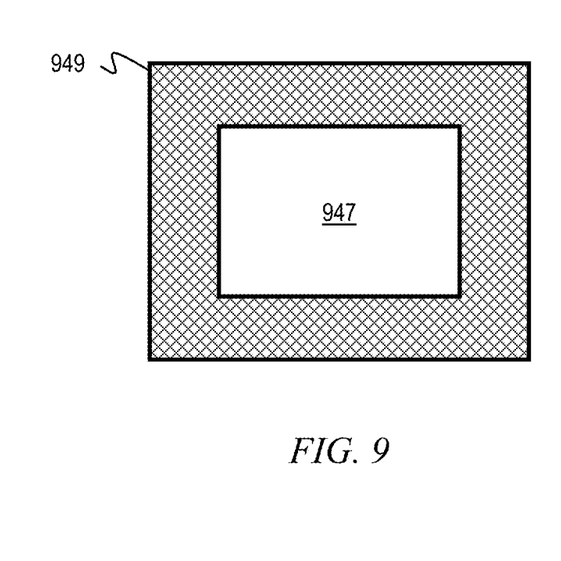
FIG. 9 shows an embodiment wherein a perimeter of a surface of encapsulation material is patterned, according to an embodiment of the invention.

FIG. 8 shows an embodiment where the entire surface of encapsulation material 851 is patterned (corresponding to case where entire mold cavity surface is treated), while FIG. 9 shows an embodiment where only the perimeter of the surface of the encapsulation material 949 is patterned, with an interior portion 947 not patterned (corresponding to case where frame at the perimeter of the mold cavity surface is treated).

Non-limiting examples of TIM include known thermal greases, putties and gel materials that are soft and have a tendency to move or flow under cyclic stress.

Furthermore regarding channel patterns, hierarchal nested channel patterns could be used in some instances as described in US Patent Publication 2006/0286712A1 of Thomas J. Brunschwiler et al., "Thermal interface with a patterned structure," the complete disclosure of which is expressly incorporated herein by reference in its entirety for all purposes. However, as stated above, the vertical walls of the channels should have a draft angle to allow easy release from the mold after transfer molding. In the case of machined patterns, channel depth can vary from 10 microns to a depth not to exceed the thickness of the molding compound above the wirebonds, which is typically 0.25 to 0.5 mm thick. To prevent the migration of a soft thermal interface material out of the gap between a component surface and a heat spreader, the depth in the surface should not have to exceed 100 microns. More typically, a depth of 10 microns should be adequate. A minimum depth of three microns is appropriate in one or more embodiments.

Given the discussion thus far, it will be appreciated that, in general terms, an exemplary method includes the step of introducing into a mold cavity 575 an electronic component to be encapsulated (e.g., 610, 612, 614, optionally 618). The mold cavity includes at least first and second halves 579, 577. At least one of the halves (in the example of FIG. 6, 579) is formed with a negative 573 of a thermal-interface-material engaging pattern thereon. A further step includes introducing into the mold cavity 575 an encapsulating material 616 which encapsulates the electronic component and engages the negative 573 of the thermal-interface-material engaging pattern.

An even further step includes allowing the encapsulating material to solidify such that a thermal-interface-material engaging surface of the encapsulant solidifies with the thermal-interface-material engaging pattern thereon (as shown in FIGS. 4 and 5).

In some cases, further steps include mounting the electronic component on a printed circuit board 402, and securing a heat sink 404 to the electronic component on the printed circuit board with a thermal interface material 406 intermediate the heat sink and the thermal-interface-material engaging pattern of the solidified encapsulating material, such that the thermal-interface-material engaging pattern engages the thermal interface material 406 to resist lateral motion of the thermal interface material. Known techniques can be used to secure the components together.

In some instances, in the securing step, the thermal interface material includes at least one of thermal grease, thermal putty, and thermal gel.

In one or more embodiments, in the step of introducing the electronic component into the mold cavity, the encapsulating material includes a release agent. In at least some such cases, when the encapsulating material solidifies, the thermal-interface-material engaging surface has a surface energy less than thirty five ergs per square centimeter.

In some cases, in the step of introducing the electronic component into the mold cavity, the thermal-interface-material engaging pattern has an average roughness of at least three microns. As noted, non-limiting examples of suitable patterns include a diamond pattern and/or a channel pattern.

Given the discussion thus far, it will be appreciated that, in general terms, another exemplary method according to another aspect of the invention includes the step of providing an encapsulated electronic component (e.g. 410-1, 410-2; 412-1, 412-2, 414-1, 414-2; and optionally 418-1, 418-2) mounted on a printed circuit board. The encapsulated electronic component has an outward-facing thermal-interface-material engaging pattern on an encapsulant 416-1, 416-2 thereof (i.e., "teeth" on outer surface of the encapsulant). A further step includes securing a heat sink 404 to the encapsulated electronic component on the printed circuit board 402 with a thermal interface material 406 intermediate the heat sink and the thermal-interface-material engaging pattern of the encapsulant 416-1, 416-2 such that the thermal-interface-material engaging pattern engages the thermal interface material to resist lateral motion of the thermal interface material.

As discussed elsewhere, in the securing step, the thermal interface material can include, for example, at least one of thermal grease, thermal putty, and thermal gel.

Further, as discussed elsewhere, in the providing step, the encapsulating material can include a release agent. The thermal-interface-material engaging pattern may have a surface energy less than thirty five ergs per square centimeter.

The thermal-interface-material engaging pattern has, in one or more embodiments, an average roughness of at least three microns, and as noted, can include, for example, a diamond pattern or a channel pattern.

In any of the methods disclosed herein, the method steps can advantageously be carried out without wiping the thermal-interface-material engaging pattern (surface) with alcohol, without abrading the thermal-interface-material engaging pattern (surface), without exposing the thermal-interface-material engaging pattern (surface) to a plasma cleaning process, without exposing the thermal-interface-material engaging pattern (surface) to ultraviolet light, and without exposing the thermal-interface-material engaging pattern (surface) to ozone.

Furthermore, given the discussion thus far, it will be appreciated that, in general terms, an exemplary assembly according to another aspect of the invention includes a printed circuit board 402 and an encapsulated electronic component (e.g. 410-1, 410-2; 412-1, 412-2, 414-1, 414-2; and optionally 418-1, 418-2) mounted on the printed circuit board. The encapsulated electronic component in turn includes an encapsulant 416-1, 416-2 with an outward-facing thermal-interface-material engaging pattern thereon. Also included are a heat sink 404 and a thermal interface material 406 intermediate the heat sink and the thermal-interface-material engaging pattern of the encapsulant. The heat sink is assembled to the printed circuit board such that the thermal-interface-material engaging pattern engages the thermal interface material to resist lateral motion of the thermal interface material.

The thermal interface material can be, for example, thermal grease, thermal putty, and/or thermal gel. In one or more embodiments, the encapsulant includes a release agent and the outward-facing thermal-interface-material engaging pattern has a surface energy less than thirty five ergs per square centimeter.

As noted, the outward-facing thermal-interface-material engaging pattern can have an average roughness of at least three microns. The outward-facing thermal-interface-material engaging pattern can have draft angle of at least one degree from vertical. The outward-facing thermal-interface-material engaging pattern can be, for example, a diamond pattern or a channel pattern.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    introducing into a mold cavity an electronic component to be encapsulated, said mold cavity comprising at least first and second halves, at least one of said halves being formed with a negative of a thermal-interface-material engaging pattern thereon;
    introducing into said mold cavity an encapsulating material which encapsulates said electronic component and engages said negative of said thermal-interface-material engaging pattern; and
    allowing said encapsulating material to solidify such that a thermal-interface-material engaging surface of said encapsulant solidifies with said thermal-interface-material engaging pattern thereon;
    wherein, in said introducing of said electronic component into said mold cavity, said encapsulating material comprises a release agent; and
    wherein in said allowing of said encapsulating material to solidify, said thermal-interface-material engaging surface has a surface energy less than thirty-five ergs per square centimeter.

* * * * *